(12) United States Patent
Yamasaki et al.

(10) Patent No.: US 9,024,641 B2
(45) Date of Patent: May 5, 2015

(54) WIRE BREAKAGE DETECTING METHOD FOR HIGH VOLTAGE GENERATING DEVICE

(75) Inventors: Isamu Yamasaki, Toyota (JP); Kimiyoshi Nagai, Yokohama (JP)

(73) Assignee: Toyota Jidosha Kabushiki Kaisha, Toyota-Shi (JP)

(*) Notice: Subject to any disclaimer, the term of this patent is extended or adjusted under 35 U.S.C. 154(b) by 380 days.

(21) Appl. No.: 13/499,660

(22) PCT Filed: Oct. 1, 2010

(86) PCT No.: PCT/IB2010/002649
§ 371 (c)(1),
(2), (4) Date: Mar. 30, 2012

(87) PCT Pub. No.: WO2011/039645
PCT Pub. Date: Apr. 7, 2011

(65) Prior Publication Data
US 2012/0187957 A1   Jul. 26, 2012

(30) Foreign Application Priority Data

Oct. 2, 2009 (JP) ................................ 2009-230729

(51) Int. Cl.
*G01R 31/02* (2006.01)
*B05B 5/08* (2006.01)
(Continued)

(52) U.S. Cl.
CPC . *B05B 5/087* (2013.01); *B05B 5/10* (2013.01); *B05B 13/0431* (2013.01); *G01R 31/021* (2013.01); *G01R 31/026* (2013.01)

(58) Field of Classification Search
CPC ...... B05B 5/087; B05B 5/10; B05B 13/0431; G01R 31/026; G01R 31/021

USPC ............ 324/539, 537, 541, 543, 544; 363/59, 363/60
See application file for complete search history.

(56) References Cited

U.S. PATENT DOCUMENTS

| 4,893,227 A | * | 1/1990 | Gallios et al. | 363/26 |
| 4,991,174 A | * | 2/1991 | Mori et al. | 714/10 |
| RE43,516 E | * | 7/2012 | Adragna et al. | 363/50 |

(Continued)

FOREIGN PATENT DOCUMENTS

| EP | 0 626 209 A1 | 11/1994 |
| EP | 0 753 923 A1 | 1/1997 |

(Continued)

OTHER PUBLICATIONS

International Search Report and Written Opinion of PCT/IB2010/002649 mailed Jan. 24, 2011.

*Primary Examiner* — Huy Q Phan
*Assistant Examiner* — David Frederiksen
(74) *Attorney, Agent, or Firm* — Kenyon & Kenyon LLP

(57) ABSTRACT

A method of detecting a wire break in a high voltage generating device that is configured to detect a wire breakage in a low-voltage cable is disclosed. The method of a wire break includes: detecting whether a wire break has occurred in each of the lines in accordance with a combination pattern of whether the time differential value of an IM signal value of a CW circuit obtained when an operating voltage is boosted is positive, negative, or 0, and whether the time differential value of a VM signal value obtained after the operating voltage is boosted by the CW circuit is positive, negative, or 0; and identifying which of the lines is broken.

3 Claims, 9 Drawing Sheets

(51) Int. Cl.
  *B05B 5/10* (2006.01)
  *B05B 13/04* (2006.01)

(56) References Cited

U.S. PATENT DOCUMENTS

| | | | |
|---|---|---|---|
| 8,564,986 B2 * | 10/2013 | Wing et al. | 363/61 |
| 2003/0015977 A1 * | 1/2003 | Lee et al. | 318/114 |
| 2008/0158760 A1 * | 7/2008 | Moyer et al. | 361/93.1 |
| 2008/0231286 A1 * | 9/2008 | Tsunekazu et al. | 324/509 |

FOREIGN PATENT DOCUMENTS

| | | |
|---|---|---|
| EP | 1 738 855 A1 | 1/2007 |
| JP | 06-320066 A | 11/1994 |
| JP | 2000-115988 A | 4/2000 |
| JP | 2001-232481 A | 8/2001 |
| JP | 2002-186884 A | 7/2002 |
| JP | 2005-066410 A | 3/2005 |

* cited by examiner

FIG.9

| | SLOPE OF TANGENT TO FEEDBACK SIGNAL (TIME DIFFERENTIAL VALUE) | |
|---|---|---|
| | IM SIGNAL VALUE | VM SIGNAL VALUE |
| CT INPUT LINE (LOCATION OF WIRE BREAKAGE) | ↘ | ↘ |
| DA INPUT LINE | ↘ | ↘ |
| DB INPUT LINE | ↘ | ↘ |
| IM SIGNAL LINE | ↗ | → |
| VM SIGNAL LINE | → | ↗ |

WIRE BREAKAGE DETECTING METHOD FOR HIGH VOLTAGE GENERATING DEVICE

This is a 371 national phase application of PCT/IB2010/002649 filed 1 Oct. 2010, claiming priority to Japanese Patent Application No. 2009-230729 filed 2 Oct. 2009, the contents of which are incorporated herein by reference.

FIELD OF THE INVENTION

The present invention relates to a wire breakage detecting method for a high voltage generating device.

BACKGROUND OF THE INVENTION

An electrostatic painting apparatus includes a high voltage generating device that applies a high voltage to paint, a paint gun, and so forth. In electrostatic painting performed by the electrostatic painting apparatus, the high voltage generating device applies a negative high voltage to charge paint to a negative potential, and the potential of a paint target object is set to "0" (by grounding the paint target object). Thus, an electrostatic field is formed between the paint and the paint target object to perform electrostatic painting on the paint target object.

The high voltage generating device includes a voltage generating section that generates an operating voltage, and a voltage boosting section (a so-called cascade) that boosts the operating voltage which is generated by the voltage generating section. These sections are typically electrically connected through a low-voltage cable. In the thus configured high voltage generating device, a wire breakage may occur in the low-voltage cable. Thus, it is desired to develop a technique for accurately detecting such a wire breakage.

For example, there are disclosed techniques for detecting an abnormality that occurs in a high voltage generating device. Japanese Patent Application Publication No. 6-320066 (JP-A-6-320066) discloses a technique in which a "di/dt value" is defined as the maximum value of an increase in output current of a high voltage generating device allowed while an output voltage of the high voltage generating device increases by a predetermined value, and the "di/dt value" is evaluated every predetermined time. Specifically, an overload state (high-voltage abnormality) is detected in accordance with the amount of variation over time in current value during application of a high voltage. For example, a high-voltage abnormality is determined in the case where the current value increases by 40 μA or more in 10 msec.

Japanese Patent Application Publication No. 2005-66410 (JP-A-2005-66410) discloses a technique in which an absolute sensitivity circuit that stops the supply of a high voltage from a high voltage generating device when an output current from the high voltage generating device exceeds a prescribed maximum value is provided, and a slope sensitivity circuit that stops the supply of a high voltage from the high voltage generating device when the amount of increase in output current from the high voltage generating device per unit time exceeds a prescribed maximum increase amount is provided.

According to such techniques, the following advantages are obtained. (1) In the case where the paint gun approaches the paint target object at a low speed, a high-voltage abnormality can be detected if the output voltage exceeds the maximum set value. (2) In the case where the paint gun approaches the paint target object at a high speed, a high-voltage abnormality can be detected if the amount of increase in output current per unit time exceeds the maximum set value (even if the output voltage does not exceed the maximum set value). (3) A high-voltage abnormality can be detected if a leak current increases due to a paint stain or the like on the paint gun or the like to cause the output voltage to exceed the maximum set value.

In the case where a wire breakage occurs in the low-voltage cable of the high voltage generating device, a high voltage cannot be output. Therefore, the presence or absence of a wire breakage can be detected by monitoring the current value and the amount of variation over time in current value using the techniques disclosed in JP-A-6-320066 and JP-A-2005-66410.

In the initial stage of a wire breakage in the low-voltage cable, however, it is often the case that the wire is not completely broken and the broken portion becomes continuous again as the electrostatic painting apparatus operates. It is difficult to reliably detect such a momentary wire breakage (a so-called chattering) in accordance with the current value and the amount of variation over time in current value, because apparently a normal continuous state is immediately restored. That is, it is difficult to accurately detect a momentary wire breakage in the low-voltage cable using the techniques disclosed in JP-A-6-320066 and JP-A-2005-66410.

If such a momentary wire breakage can be reliably detected, effective preventive measures can be taken such as by replacing the low-voltage cable before the low-voltage cable is completely broken. Thus, the development of a technique that allows accurate detection of a momentary wire breakage in the low-voltage cable is desired.

SUMMARY OF THE INVENTION

The present invention provides a wire breakage detecting method for a high voltage generating device that specifically includes a Cockcroft-Walton voltage boosting circuit (hereinafter referred to as a "CW circuit") that allows accurate detection of a momentary wire breakage in a low-voltage cable of the high voltage generating device.

An aspect of the present invention relates to a wire breakage detecting method for a high voltage generating device. The high voltage generating device includes: a voltage generating section that generates a voltage; a voltage boosting section that incorporates a CW circuit for boosting voltage generated by the voltage generating section; an input line that connects the voltage generating section to the voltage boosting section so that the generated voltage is input to the CW circuit; a current feedback line that connects the voltage generating section to the voltage boosting section so that a value of a current flowing through the Cockcroft-Walton voltage boosting circuit, after the voltage is boosted, is fed back to the voltage generating section; and a voltage feedback line that connects the voltage generating section to the voltage boosting section so that a value of the voltage boosted by the CW circuit is fed back to the voltage generating section. The method of detecting a wire break is configured to detect a wire breakage in the input line, the current feedback line, and the voltage feedback line. The method of detecting a wire break includes: detecting whether a wire break has occurred in the input line, the current feedback line, and the voltage feedback line in accordance with a combination pattern of whether a time differential value of the value of the current flowing through the CW circuit when the voltage is boosted is positive, negative, or 0, and whether a time differential value of the value of the voltage after being boosted by the CW circuit is positive, negative, or 0; and identifying which of the input line, the current feedback line, and the voltage feedback line is broken.

According to the method of detecting a wire break, it is possible to accurately detect a momentary wire breakage in the low-voltage cable in the high voltage generating device which includes the CW circuit.

In the method, it may be determined that the wire break has occurred in the input line if the combination pattern in which the time differential value of the value of the current is negative and the time differential value of the value of the voltage is negative.

According to the method, it is possible to accurately detect a momentary wire breakage in the input line in the high voltage generating device which includes the CW circuit.

In the method, it may be determined the wire break has occurred in the current feedback line if the combination pattern in which the time differential value of the value of the current is 0 and the time differential value of the value of the voltage is positive.

According to the method, it is possible to accurately detect a momentary wire breakage in the current feedback line in the high voltage generating device which includes the CW circuit.

In the method of detecting a wire break, it may be determined that the wire break has occurred in the voltage feedback line if the combination patten in which the time differential value of the value of the current is positive and the time differential value of the value of the voltage is 0.

According to the method, it is possible to accurately detect a momentary wire breakage in the voltage feedback line in the high voltage generating device which includes the CW circuit.

In the method of detecting a wire break, the voltage generating section may detect the time differential value of the value of the current and the time differential value of the value of the voltage, and detection of the occurrence of a wire break may be performed at a frequency of 10 Hz or more.

According to the method, it is possible to more accurately detect a momentary wire breakage in the low-voltage cable in the high voltage generating device which includes the CW circuit. In addition, erroneous detection can be prevented by eliminating the effect of noise.

BRIEF DESCRIPTION OF THE DRAWINGS

The foregoing and further features and advantages of the invention will become apparent from the following description of preferred embodiments with reference to the accompanying drawings, wherein like numerals are used to represent like elements and wherein:

FIG. 4 illustrates the characteristics of the high voltage generating device which includes a CW circuit, in which

FIG. 9 illustrates variations in IM signal value and VM signal value that occur when each line of a low-voltage cable is momentarily broken.

DETAILED DESCRIPTION OF THE EMBODIMENTS

An embodiment of the present invention will be described below. First of all, the overall configuration of an electrostatic painting apparatus to which an abnormality detecting method is applied according to the embodiment of the present invention will be described with reference to FIGS. 1 and 2.

Figure 1:
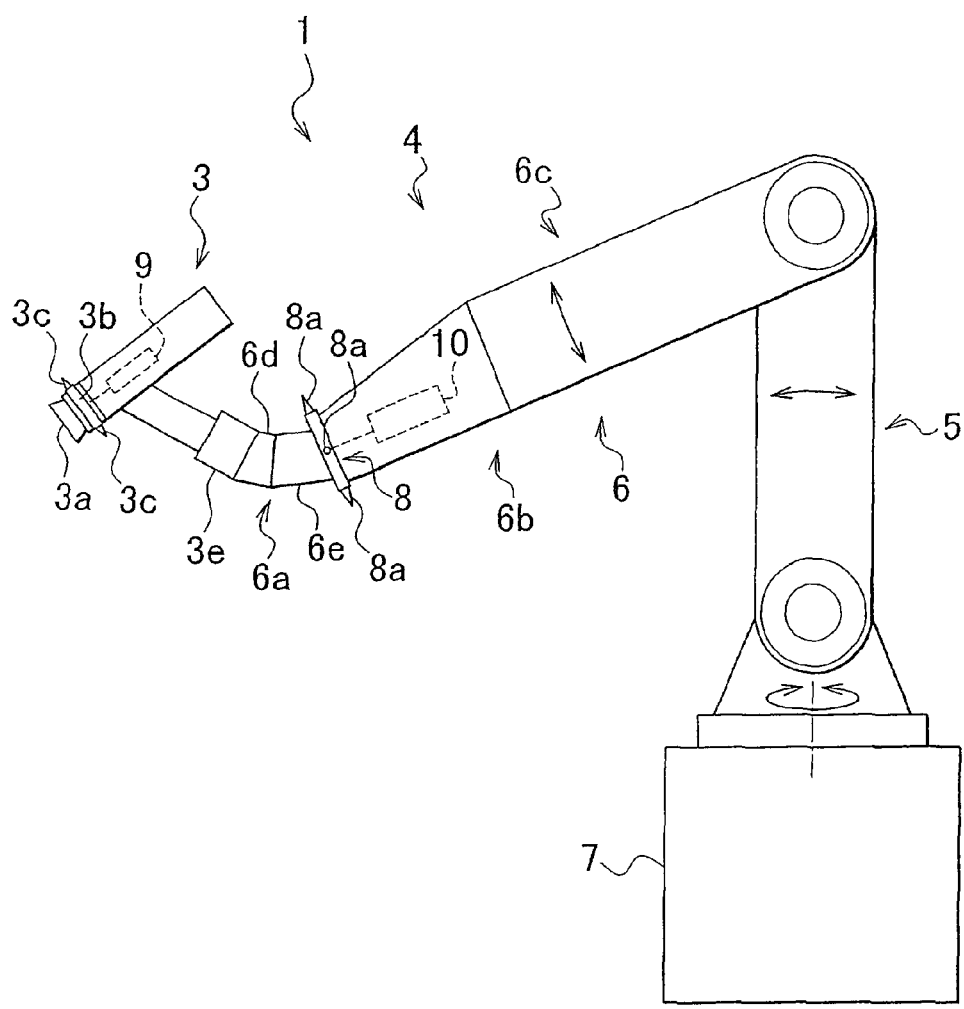
FIG. 1 is a schematic view showing the overall configuration of an electrostatic painting apparatus to which a wire breakage detecting method is applied according to an embodiment of the present invention.
Figure 2:
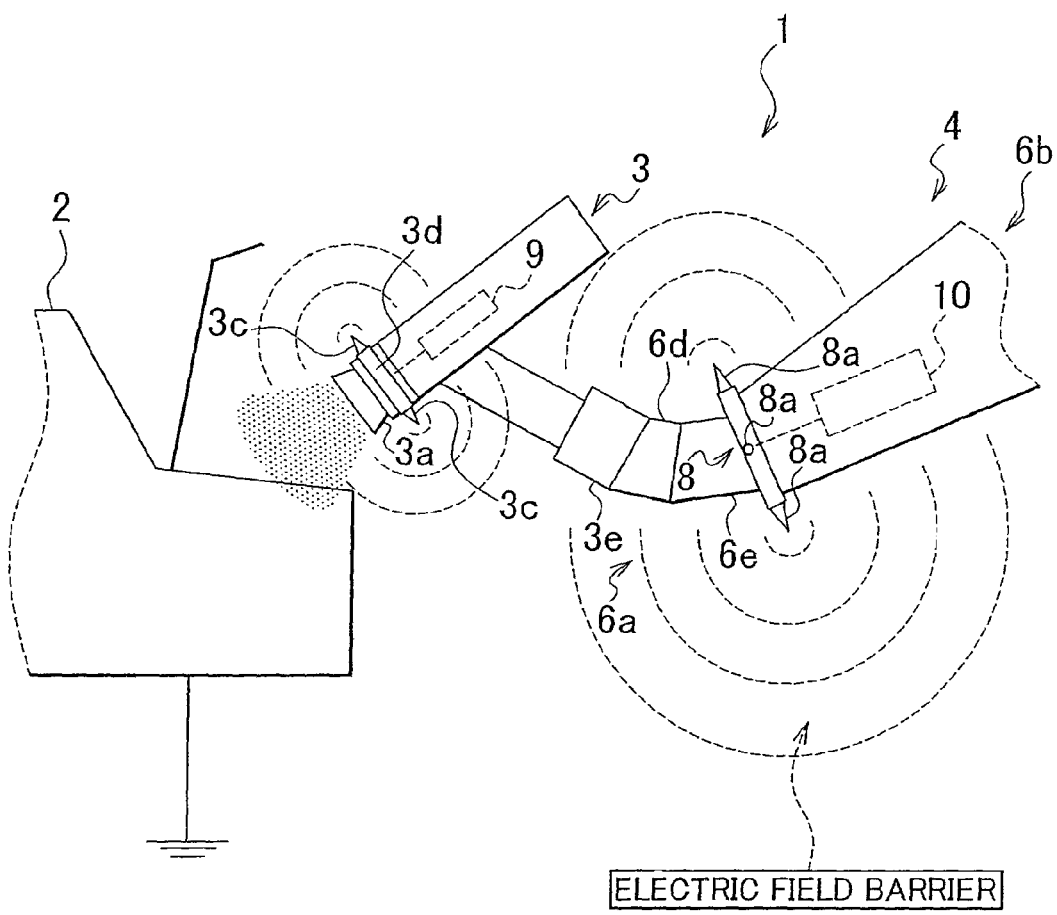
FIG. 2 is a schematic view showing the installed state of a high voltage generating device to which the wire breakage detecting method is applied according to the embodiment of the present invention.

As shown in FIGS. 1 and 2, an electrostatic painting apparatus 1, which is an example of an electrostatic painting apparatus that includes a high voltage generating device to which a wire breakage detecting method is applied according to the embodiment of the present invention, performs electrostatic painting on a paint target object (vehicle body 2) which is to be painted, and includes a paint gun 3, a robot arm 4, and so forth. In the embodiment, the electrostatic painting apparatus 1 which is used to paint the vehicle body 2 of an automobile is described as an example. However, the usage of the electrostatic painting apparatus which includes the high voltage generating device to which the wire breakage detecting method is applied according to the present invention is not limited to painting a vehicle body of an automobile.

The paint gun 3 is a device that sprays paint onto the paint target object (vehicle body 2), and includes a bell cup 3a, a ring electrode 3b, a high voltage generating device 9, and, so forth.

The paint gun 3 is a rotary atomizing type painting apparatus in which the bell cup 3a is rotated by driving means such as an air motor (not shown) to atomize fluid paint spread over the inner surface of the bell cup 3a by a centrifugal force, and the high voltage generating device 9 applies a negative electrostatic high voltage to the paint gun 3 to negatively charge atomized particles of the paint. Then, electrostatic painting is performed on the vehicle body 2 utilizing an electrostatic field formed between the negatively charged paint and the paint target object (vehicle body 2) which is grounded (that is, at a potential of 0 V).

As shown in FIG. 2, the paint gun 3 is negatively charged by the negative electrostatic high voltage which is generated by the high voltage generating device 9, and therefore an electromagnetic power line (not shown) is formed to extend from the surface of the paint gun 3 in the direction away therefrom. Then, the electromagnetic power line forms around the paint gun 3 an electric field barrier that repels and is repelled by the negatively charged paint mist. The electric field barrier acts to prevent a paint stain on the paint gun 3.

The negative electrostatic high voltage which is generated by the high voltage generating device 9 is further applied to the ring electrode 3b. The ring electrode 3b is provided with a plurality of needle-shaped electrodes 3c, 3c, . . . that project in radial directions from the ring electrode 3b. Then, an electromagnetic power line (not shown) formed by the needle-shaped electrodes 3c, 3c, . . . forms around the ring electrode 3b a stronger electric field barrier that repels and is repelled by the negatively charged paint mist. The electric field barrier acts to more reliably prevent a paint stain on the paint gun 3.

As shown in FIG. 1, the robot arm 4 is composed of a vertical arm 5 that is coupled at its lower portion to a base portion 7 so as to be turnable, and a horizontal arm 6 that is coupled at its rear end portion to the upper portion of the vertical arm 5 so as to be turnable. By turning the vertical arm 5 and the horizontal arm 6 about their respective turning points, the paint gun 3 which is provided at the distal end portion of the horizontal arm 6 is moved with respect to the paint target object (vehicle body 2).

The horizontal arm 6 includes a first arm portion 6a, to the distal end of which a coupling tube 3e of the paint gun 3 is coupled, a second arm portion 6b, to the distal end of which the first arm portion 6a is coupled, and a third arm portion 6c, to the distal end of which the second arm portion 6b is coupled and to the rear end of which the vertical arm 5 is coupled so as to be turnable. The third arm portion 6c is grounded (earthed) via the vertical arm 5.

The first arm portion 6a is provided with two bend portions 6d and 6e at which the first arm portion 6a can be bent. This allows the paint gun 3 to change its angle clockwise or counterclockwise in the drawing.

The coupling tube 3e, to the distal end of which the paint gun 3 is attached, is driven to rotate in the axial direction with respect to the first arm portion 6a. This allows the paint gun 3 to change its angle about the axis of the coupling tube 3e. This allows free setting of the angle of the paint gun 3 with respect to the paint target object (vehicle body 2).

The first arm portion 6a incorporates a high voltage generating device 10 so that a voltage with the same polarity as the voltage of the paint gun 3 is applied to the entire outer peripheral surface of the first arm portion 6a. Then, the high voltage generating device 10 forms an electromagnetic power line (not shown) that extends from the surface of the first arm portion 6a in the direction away therefrom. Then, the electromagnetic power line forms around the first arm portion 6a an electric field barrier that repels and is repelled by the negatively charged paint mist. The electric field barrier acts to prevent a paint stain on the first arm portion 6a (that is, the robot arm 4).

A ring electrode 8 (a ring-shaped electrostatic electrode) is provided on the outer periphery of the first arm portion 6a. A voltage with the same polarity as the voltage which is applied to the paint is applied to the ring electrode 8. The ring electrode 8 is provided with a plurality of needle-shaped electrodes 8a, 8a, . . . that have a conical shape and that project outward in radial directions from the ring electrode 8.

Then, the needle-shaped electrodes 8a, 8a, . . . form an electromagnetic power line (not shown) that extends from the needle-shaped electrodes 8a, 8a, . . . in the direction away therefrom. The electromagnetic power line forms around the first arm portion 6a (ring electrode 8) a stronger electric field barrier that repels and is repelled by the negatively charged paint mist. The electric field barrier acts to more reliably prevent a paint stain on the first arm portion 6a (that is, the robot arm 4).

Next, the overall configuration of a high voltage generating device to which a wire breakage detecting method is applied according to the embodiment of the present invention will be described with reference to FIG. 3. While the high voltage generating device 9 that applies a negative electrostatic high voltage to the paint gun 3 and paint sprayed by the paint gun 3 is described here, the high voltage generating device 10 that applies a negative electrostatic high voltage to the robot arm 4 may also be configured in the same way.

Figure 3:
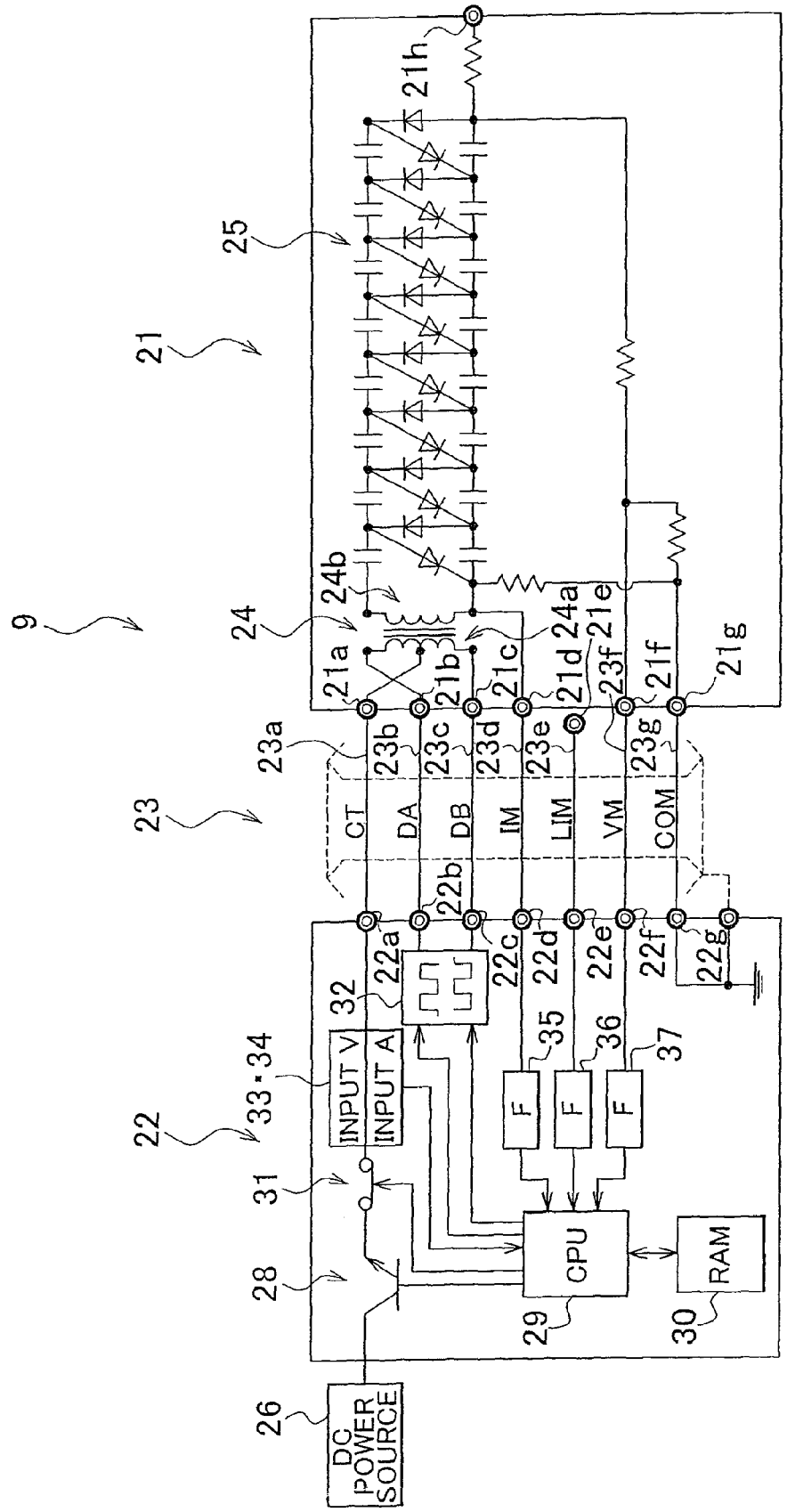
FIG. 3 is a schematic view showing the overall configuration of the high voltage generating device to which the wire breakage detecting method is applied according to the embodiment of the present invention.

As shown in FIG. 3, the high voltage generating device 9 includes a voltage boosting section 21, a voltage generating section 22, a low-voltage cable 23, and so forth.

The voltage boosting section 21 serves to boost a voltage which is generated by the voltage generating section 22, and includes a high-voltage transformer 24 and a CW circuit 25 that is a rectifier and multiplier for generating a high voltage and that is composed by combining a plurality of capacitors, diodes, and so forth. The high-voltage transformer 24 includes a primary winding 24a and a secondary winding 24b. The CW circuit 25 is connected to the secondary winding 24b side of the high-voltage transformer 24.

The voltage boosting section 21 also includes an input terminal 21a that is connected to a center phase (hereinafter referred to as a CT phase) of the primary winding 24a of the high-voltage transformer 24, an input terminal 21b that is connected to a drive A phase (hereinafter referred to as a DA phase) of the primary winding 24a, and an input terminal 21c that is connected to a drive B phase (hereinafter referred to as a DB phase) of the primary winding 24a. The voltage boosting section 21 further includes an output terminal 21d that outputs a current feedback signal (hereinafter referred to as an IM signal) that indicates the value of all the current generated by the CW circuit 25, an output terminal 21f that outputs a voltage feedback signal (hereinafter referred to as a VM signal) that indicates the value of the high voltage which has been boosted by the CW circuit 25, a ground terminal 21g that allows the CW circuit 25 to be grounded, a high-voltage output terminal 21h that outputs the high voltage which has been boosted by the CW circuit 25, and so forth.

The voltage generating section 22 serves to generate a voltage that is to be boosted to a high voltage to be applied to the paint gun 3 etc., and includes a power source section 26, an amplifier 28, a CPU 29, a RAM 30, a relay 31, a push-pull oscillator 32, a voltage sensor 33, a current sensor 34, band-pass filters 35, 36, and 37, and so forth.

In the voltage generating section 22, the amplifier 28 adjusts an output voltage that is generated by the power source section 26 in accordance with a command value from the CPU 29 to generate an operating voltage. The generated operating voltage is adjusted to match the command value by feeding back to the CPU 29 values measured by the voltage sensor 33 and the current sensor 34 which are provided on a supply line for the operating voltage.

The command value sent from the CPU 29 to the amplifier 28 is obtained by feeding back the IM signal and the VM signal to the CPU 29, which computes the command value on the basis of the feedback signals, conditions that are stored in the RAM 29, and so forth. The IM signal, the VM signal, and so forth are input to the CPU 29 via the band-pass filters 35, 36, and 37 and so forth.

Also, in the voltage generating section 22, the push-pull oscillator 32 generates drive signals to be input to the respective drive phases of the primary winding 24a in accordance with a command value from the CPU 29. The command value sent from the CPU 29 to the push-pull oscillator 32 is obtained by feeding back the IM signal and the VM signal to the CPU 29, which computes the command value on the basis of the feedback signals, conditions that are stored in the RAM 29, and so forth.

Further, the voltage boosting section 22 includes the relay 31 which is provided on the supply line for the operating voltage. In the case where an abnormality is detected from the results of the computation performed by the CPU 29 on the basis of the feedback signals, the conditions which are stored in the RAM 29, and so forth, the relay 31 is immediately actuated to block the supply of the operating voltage. This reliably prevents output of an abnormally high voltage from the high voltage generating device 9, for example.

The voltage generating section 22 also includes an output terminal 22a that outputs an operating voltage for the CT phase of the primary winding 24a, an output terminal 22b that outputs a drive signal for the DA phase of the primary winding 24a, and an output terminal 22c that outputs a drive signal for the DB phase of the primary winding 24a. The voltage generating section 22 further includes an input terminal 22d that allows input of the IM signal to the CPU 29, an input terminal 22e that allows input of a leak current feedback signal to the CPU 29, an input terminal 22f that allows input of the VM signal to the CPU 29, a ground terminal 22g that allows the voltage generating section 22 to be grounded, and so forth.

The low-voltage cable 23 is a bundle of various wires that electrically connect the voltage generating section 22 and the voltage boosting section 21, and include a CT input line (CT) 23a, a DA input line (DA) 23b, a DB input line (DB) 23c, an IM signal line (IM) 23d, a leak current feedback line (LIM) 23e, a VM signal line (VM) 23f, a common line (COM) 23g, and so forth.

The CT input line 23a is a wire that allows input of the operating voltage which is generated by the voltage generating section 22 to the CT phase of the primary winding 24a, and is connected between the input terminal 21a of the voltage boosting section 21 and the output terminal 22a of the voltage generating section 22.

The DA input line 23b is a wire that allows input of the drive signal which is generated by the voltage generating section 22 to the drive A phase of the primary winding 24a, and is connected between the input terminal 21b of the voltage boosting section 21 and the output terminal 22b of the voltage generating section 22.

The DB input line 23c is a wire that allows input of the drive signal which is generated by the voltage generating section 22 to the drive B phase of the primary winding 24a, and is connected between the input terminal 21c of the voltage boosting section 21 and the output terminal 22c of the voltage generating section 22.

The IM signal line 23d is a wire that allows input of the IM signal which is generated by the voltage boosting section 21 to the CPU 29, and is connected between the output terminal 21d of the voltage boosting section 21 and the input terminal 22d of the voltage generating section 22.

The VM signal line 23f is a wire that allows input of the VM signal which is generated by the voltage boosting section 21 to the CPU 29, and is connected between the output terminal 21f of the voltage boosting section 21 and the input terminal 22f of the voltage generating section 22.

The leak current feedback line 23e is a wire that allows feedback of a leak current in the voltage boosting section 21 to the CPU 29, and is connected between a housing of the voltage boosting section 21 and the input terminal 22e of the voltage generating section 22.

The common line 23g is a wire that allows setting of a reference potential (0 V) that is common to the voltage boosting section 21 and the voltage generating section 22, and is connected between the ground terminal 21g of the voltage boosting section 21 and the ground terminal 22g of the voltage generating section 22.

Figure 4A:
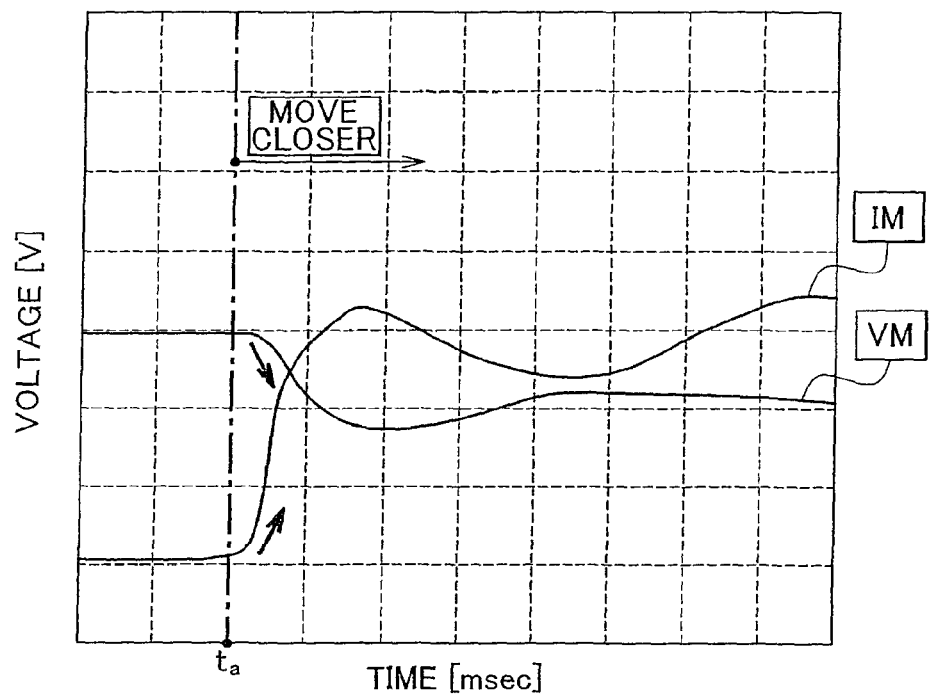
FIG. 4A shows normal variations in IM signal value and VM signal value that occur in the case where a paint gun and a paint target object abruptly move closer to each other.

Next, the general characteristics of the high voltage generating device which includes the CW circuit will be described with reference to FIG. 4. As shown in FIG. 4A, when the paint gun 3 is abruptly moved closer to the vehicle body 2 at time $t_a$ in the high voltage generating device 9 which includes the CW circuit 25, the electric field strength of the electrostatic field that is formed between the vehicle body 2 and the paint gun 3 is increased, which increases the value of the current that flows through the CW circuit 25 to increase the signal value of the IM signal. The signal value of the IM signal is a voltage value, and is hereinafter referred to as an IM signal value.

At this time, in response to the increase in IM signal value, the CPU 29 performs adjustment so as to keep the electric field strength of the electrostatic field constant. The CPU 29 issues a command for reducing the operating voltage which is generated by the voltage generating section 22, as a result of which the signal value (voltage) of the VM signal is decreased. The signal value of the VM signal is a voltage value, and is hereinafter referred to as a VM signal value.

Figure 4B:
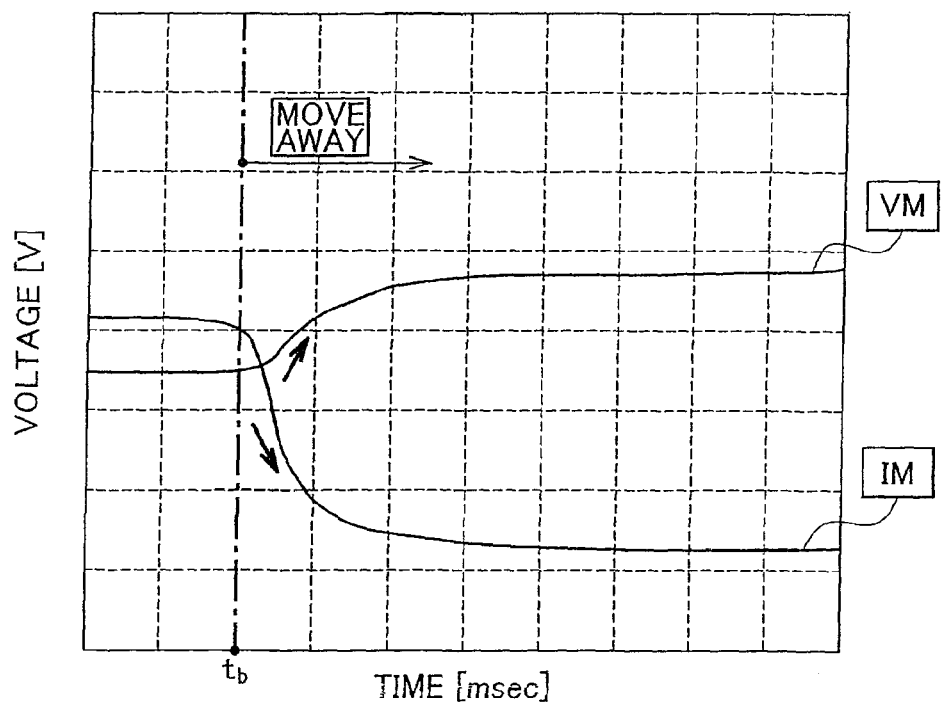
FIG. 4B shows normal variations in IM signal value and VM signal value that occur in the case where the paint gun and the paint target object abruptly move away from each other.

Next, as shown in FIG. 4B, when the vehicle body 2 and the paint gun 3 are abruptly moved away from each other at time $t_b$ in the high voltage generating device 9 which includes the CW circuit 25, the electric field strength of the electrostatic field that is formed between the vehicle body 2 and the paint gun 3 is reduced, which decreases the value of the current that flows through the CW circuit 25 to decrease the IM signal value.

At this time, in response to the decrease in IM signal value, the CPU 29 performs adjustment so as to keep the electric field strength of the electrostatic field constant. The CPU 29 issues a command for increasing the operating voltage which is generated by the voltage generating section 22, as a result of which the VM signal value is increased.

The wire breakage detecting method for a high voltage generating device according to the present invention utilizes the combination pattern of typical variations in IM signal value and VM signal value in a high voltage generating device which includes a CW circuit to detect a wire breakage in a low-voltage cable and identify the location of the wire breakage. The wire breakage detecting method will be specifically described below.

The results of an experiment conducted to verify variations in signal values that occur in the case where each wire in the low-voltage cable is momentarily broken in the high voltage generating device which includes the CW circuit will be described with reference to FIGS. 5 to 8. The IM signal value and the VM signal value given below are the values measured at the output terminals 21d and 21f of the voltage boosting section 21, and may be different from the values actually fed back to the CPU 29 when a wire breakage occurs. This is because no IM signal or VM signal would be input to the input terminal 22d or 22f of the voltage generating section 22 if the IM signal line 23d or the VM signal line 23f were broken.

Figure 5:
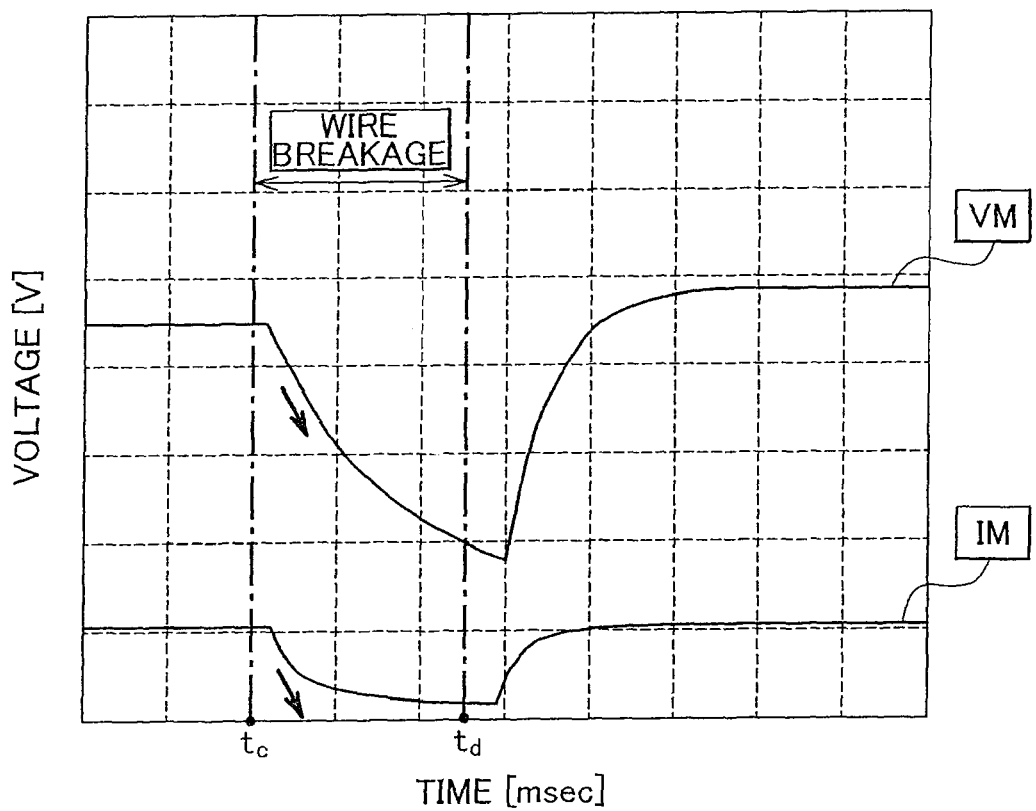
FIG. 5 shows variations in IM signal value and VM signal value that occur in the case where a CT input line is momentarily broken in the high voltage generating device which includes the CW circuit.

First of all, variations in signal values that occur in the case where the CT input line 23a is momentarily broken will be described with reference to FIG. 5. As shown in FIG. 5, when the CT input line 23a is momentarily broken for a period from time $t_c$ to time $t_d$, the IM signal value starts decreasing. This is because the wire breakage in the CT input line 23a decreases the operating voltage supplied to the CW circuit 25. Therefore, when the CT input line 23a is momentarily broken, the time differential value of (the slope of the tangent to) the IM signal value inevitably takes a negative value. In the experiment, the duration of the momentary wire breakage from time $t_c$ to time $t_d$ is set to 100 msec (the same applies below).

When the CT input line 23a is momentarily broken for the period from time $t_c$ to time $t_d$, the VM signal value also starts decreasing. This is because the wire breakage in the CT input line 23a reduces the operating voltage supplied to the CW circuit 25, which reduces the value of the high voltage which has been boosted by the CW circuit 25. Therefore, when the CT input line 23a is momentarily broken, the time differential value of (the slope of the tangent to) the VM signal value inevitably takes a negative value.

Figure 6:
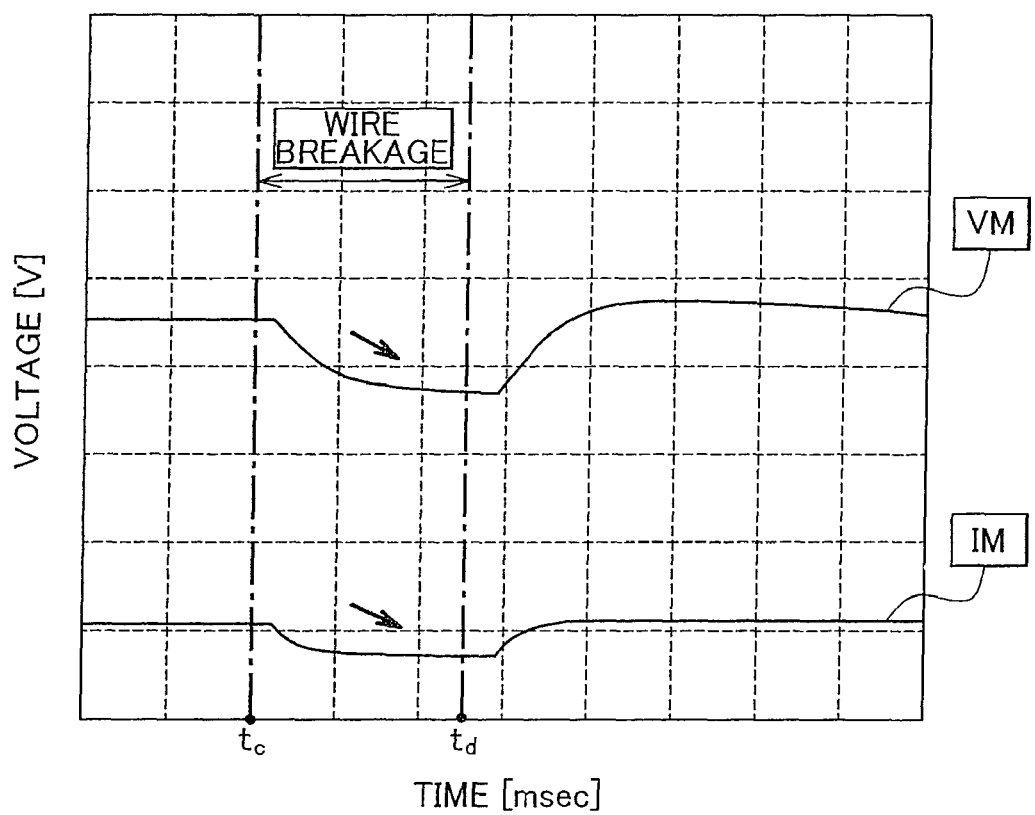
FIG. 6 shows variations in IM signal value and VM signal value that occur in the case where a DA input line or a DB input line is momentarily broken.

Next, variations in signal values that occur in the case where the DA input line 23b or the DB input line 23c is momentarily broken will be described with reference to FIG. 6. As shown in FIG. 6, when the DA input line 23b or the DB input line 23c is momentarily broken for a period from time $t_c$ to time $t_d$, the IM signal value starts decreasing. This is because the wire breakage in the DA input line 23b or the DB input line 23c decreases the drive signal which is supplied to the CW circuit 25. Therefore, when the DA input line 23b or the DB input line 23c is momentarily broken, the time differential value of (the slope of the tangent to) the IM signal value inevitably takes a negative value.

When the DA input line 23b or the DB input line 23c is momentarily broken for the period from time $t_c$ to time $t_d$, the VM signal value also starts decreasing. This is because the wire breakage in the DA input line 23b or the DB input line 23c decreases the drive signal which is supplied to the CW circuit 25, which reduces the value of the high voltage which has been: boosted by the CW circuit 25. Therefore, when the DA input line 23b or the DB input line 23c is momentarily broken, the time differential value of (the slope of the tangent to) the VM signal value inevitably takes a negative value.

That is, the wire breakage detecting method for the high voltage generating device 9 according to the embodiment of the present invention identifies a wire breakage in an input line (the CT input line 23a, the DA input line 23b, or the DB input line 23c) in the case of a combination pattern in which the time differential value of the IM signal value, which is the current value of the CW circuit 25 obtained when the operating voltage is boosted, is negative and the time differential value of the VM signal value, which is the voltage value of the operating voltage after being boosted by the CW circuit 25, is negative. This allows accurate detection of a wire breakage in an input line (the CT input line 23a, the DA input line 23b, or the DB input line 23c) of the high voltage generating device 9.

Figure 7:
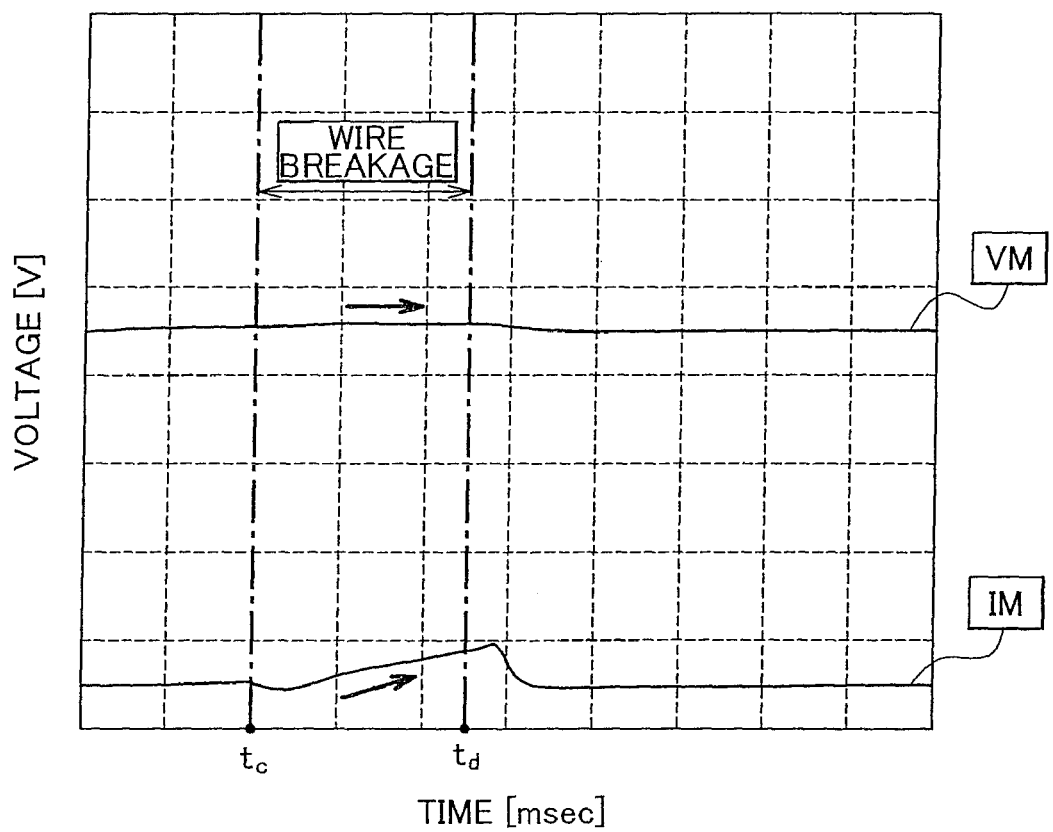
FIG. 7 shows variations in IM signal value and VM signal value that occur in the case where an IM signal line is momentarily broken.

Next, variations in signal values that occur in the case where the IM signal line 23d is momentarily broken will be described with reference to FIG. 7. As shown in FIG. 7, when the IM signal line 23d is momentarily broken for a period from time $t_c$ to time $t_d$, the IM signal value starts increasing. This is because the wire breakage in the IM signal line 23d disables the CPU 29 of the voltage generating section 22 from detecting the IM signal, which causes the CPU 29 to determine that the IM signal value is reducing. That is, the CPU 29 determines that the electric field strength of the electrostatic field is decreasing with the paint target object (vehicle body 2) and the paint gun 3 moving away from each other to give the amplifier 28 a command for increasing the operating voltage to be supplied to the CW circuit 25. Therefore, when the IM signal line 23d is momentarily broken, the time differential value of (the slope of the tangent to) the IM signal value inevitably takes a positive value.

When the IM signal line 23d is momentarily broken for the period from time $t_c$ to time $t_d$, the VM signal value is not varied. This is because even if the IM signal line 23d is broken and the operating voltage to be supplied to the CW circuit 25 is increased in response to a command from the CPU 29, the actual distance between the paint target object (vehicle body 2) and the paint gun 3 is not varied, which causes no variation in electric field strength of the electrostatic field, which in turn causes no variation in VM signal value. Therefore, when the IM signal line 23d is momentarily broken, the time differential value of (the slope of the tangent to) the VM signal value inevitably takes a value of "0".

The value of "0" as used herein does not necessarily mean the exact value of "0". Practically, the time differential value of the VM signal value does not take the exact value of "0" in many cases. Therefore, upper-limit (positive) and lower-limit (negative) thresholds are set across "0" so that the time differential value of the VM signal value is treated as "0" in the case where the time differential value of the VM signal value falls between the thresholds.

That is, the wire breakage detecting method for the high voltage generating device 9 according to the embodiment of the present invention identifies a wire breakage in the IM signal line 23d in the case of a combination pattern in which the time differential value of the IM signal value, which is the current value of the CW circuit 25 obtained when the operating voltage is boosted, is 0 and the time differential value of the VM signal value, which is the voltage value of the operating voltage after being boosted by the CW circuit 25, is positive. This allows accurate detection of a wire breakage in the IM signal line 23d of the high voltage generating device 9.

Figure 8:
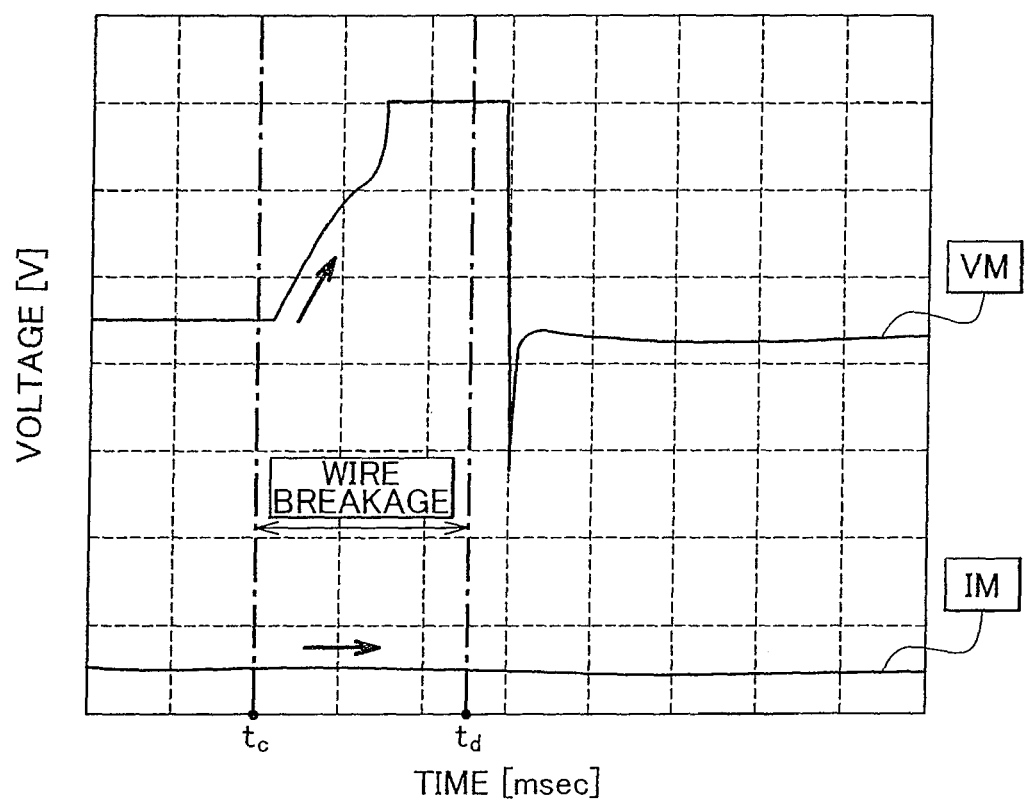
FIG. 8 shows variations in IM signal value and VM signal value that occur in the case where a VM signal line is momentarily broken.

Next, behavior in signal values that occurs in the case where the VM signal line 23f is momentarily broken will be described with reference to FIG. 8. As shown in FIG. 8, when the VM signal line 23f is momentarily broken for a period from time $t_c$ to time $t_d$, the VM signal value increases. This is because the wire breakage in the VM signal line 23f disables the CPU 29 of the voltage generating section 22 from detecting the VM signal, which causes the CPU 29 to determine that the VM signal value is decreasing. That is, the CPU 29 determines that the electric field strength of the electrostatic field is decreasing with the paint target object (vehicle body 2) and the paint gun 3 moving away from each other to give the amplifier 28 a command for increasing the operating voltage for the CW circuit 25. Therefore, when the VM signal line 23f is momentarily broken, the time differential value of (the slope of the tangent to) the VM signal value inevitably takes a positive value.

When the VM signal line 23f is momentarily broken for the period from time $t_c$ to time $t_d$, the IM signal value is not varied. This is because even if the VM signal line 23f is broken and the operating voltage for the CW circuit 25 is increased in response to a command from the CPU 29, the actual distance between the paint target object (vehicle body 2) and the paint gun 3 is not varied, which causes no variation in electric field strength of the electrostatic field, which in turn, causes no variation in IM signal value. Therefore, when the VM signal line 23f is momentarily broken, the time differential value of (the slope of the tangent to) the IM signal value inevitably takes a value of "0".

The value of "0" as used herein does not necessarily mean the exact value of "0". Practically, the time differential value of the IM signal value does not take the exact value of "0" in many cases. Therefore, upper-limit (positive) and lower-limit (negative) thresholds are set across "0" so that the time differential value of the IM signal value is treated as "0" in the case where the time differential value of the IM signal value falls between the thresholds.

That is, the wire breakage detecting method for the high voltage generating device 9 according to the embodiment of the present invention identifies a wire breakage in the VM signal line 23f in the case of a combination pattern in which the time differential value of the IM signal value, which is the current value of the CW circuit 25 obtained when the operating voltage is boosted, is positive and the time differential value of the VM signal value, which is the voltage value of the operating voltage after being boosted by the CW circuit 25, is 0. This allows accurate detection of a wire breakage in the VM signal line 23f of the high voltage generating device 9.

Next, the variations in signal values that occur in the case where each wire in the low-voltage cable is momentarily broken in the high voltage generating device which includes the CW circuit will be summarized with reference to FIG. 9. By comprehensively studying the experiment results given above, certain regularities can be found in time differential values of (slopes of the tangents to) the IM signal value and the VM signal value that are obtained in the case where a wire in the low-voltage cable 23 is momentarily broken in the high voltage generating device 9 which includes the CW circuit 25. Such regularities are as shown in FIG. 9.

Specifically, the IM signal value and the VM signal value are monitored at the output terminals 21d and 21f of the voltage boosting section 21 to determine whether or not the time differential values of (slopes of the tangents to) the respective signal values fall within any of the combination patterns shown in FIG. 9.

Then, the respective signal values are measured at a sampling period of several dozens of times in one second to make determinations as to the combination patterns. If at least one of the measurement results falls within any of the combination patterns, it is determined that a wire is broken (or may be broken).

This makes it possible to detect even a momentary wire breakage (a so-called chattering) that is immediately restored to a normal continuous state, which allows accurate detection of the presence or absence of a wire breakage in the low-voltage cable 23. Also, the wire breakage detecting method also makes it possible to identify which wire in the low-voltage cable 23 is broken.

That is, the embodiment of the present invention provides a wire breakage detecting method for the high voltage generating device 9 including: the voltage generating section 22 that generates a voltage; the voltage boosting section 21 that includes the CW circuit 25 that boosts the operating voltage which is generated by the voltage generating section 22; the CT input line 23a, the DA input line 23b, and the DB input line 23c that connect the voltage generating section 22 and the voltage boosting section 21 to input the operating voltage to the CW circuit 25; the IM signal line 23d that connects the voltage generating section 22 and the voltage boosting section 21 to feed back to the voltage generating section 22 the value of the IM signal which is a signal that indicates the value of a current that flows through the CW circuit 25 when the operating voltage is boosted; and the VM signal line 23f that connects the voltage generating section 22 and the voltage boosting section 21 to feed back to the voltage generating section 22 the value of the VM signal which is a signal that indicates the value of the operating voltage after being boosted by the CW circuit 25, the wire breakage detecting method being configured to detect a wire breakage in each of the lines 23a, 23b, 23c, 23d, and 23f, and the wire breakage detecting method including the steps of: detecting presence or absence of a wire breakage in each of the lines 23a, 23b, 23c, 23d, and 23f in accordance with a combination pattern (FIG. 9) of whether a time differential value of the IM signal value of the CW circuit 25 obtained when the operating voltage is boosted is positive, negative, or 0, and whether a time differential value of the VM signal value obtained after the operating voltage is boosted by the CW circuit 25 is positive, negative, or 0; and identifying which of the lines 23a, 23b, 23c, 23d, and 23f is broken. This allows accurate detection of a momentary wire breakage in the low-voltage cable 23 of the high voltage generating device 9.

In addition, by increasing the period for determining whether or not variations in signal values fall within any of the combination patterns shown in FIG. 9, the presence or absence of a wire breakage can be detected more accurately. If an input signal contains noise, the waveform of the time differential value of the input signal includes a steep rise and a following steep fall. Therefore, increasing the sampling period makes it possible to easily distinguish the variation pattern for noise and the variation pattern for a wire breakage. Increasing the sampling period also makes it possible to detect the variation pattern for a shorter wire breakage.

Therefore, the high voltage generating device 9 according to the embodiment of the present invention is configured to include the CPU 29 which makes it possible to increase the sampling period for the IM signal value and the VM signal value and which can perform high-speed computation and determination on the basis of the sampled signal values.

The determination period for the combination patterns may be 10 Hz or more (that is, 10 times or more in one second), preferably 20 Hz or more (that is, 20 times in one second), which allows reliable distinction of the variation pattern for noise. This in turn prevents erroneous detection of a wire breakage by eliminating the effect of the noise.

Also, by setting the determination period for the combination patterns to 10 Hz or more, preferably 20 Hz or more, even a shorter wire breakage can be detected to more reliably detect the presence or absence of a wire breakage in the low-voltage cable.

That is, in the wire breakage detecting method for the high voltage generating device 9 according to the embodiment of the present invention, the time differential value of the IM signal value, which is the current value of the CW circuit 25 obtained when the operating voltage is boosted, and the time differential value of the VM signal value, which is the voltage value of the operating voltage after being boosted by the CW circuit 25, are detected using the voltage generating section 22 (specifically, the CPU 29), and the period for detecting the presence or absence of a wire breakage is set to 10 Hz or more. This allows more accurate detection of a momentary wire breakage in the low-voltage cable 23 of the high voltage generating device 9. In addition, erroneous detection can be prevented by eliminating the effect of noise.

The invention claimed is:

1. A method of detecting a wire break in a high voltage generating device that includes:
   a voltage generating section that generates a voltage;
   a voltage boosting section that incorporates a Cockcroft-Walton voltage boosting circuit for boosting voltage generated by the voltage generating section;
   an input line that connects the voltage generating section to the voltage boosting section so that the generated voltage is input to the Cockcroft-Walton voltage boosting circuit;
   a current feedback line that connects the voltage generating section to the voltage boosting section so that a value of a current flowing through the Cockcroft-Walton voltage boosting circuit, when the voltage is boosted, is fed back to the voltage generating section; and
   a voltage feedback line that connects the voltage generating section to the voltage boosting section so that a value of the voltage boosted by the Cockcroft-Walton voltage boosting circuit is fed back to the voltage generating section, the method of detecting a wire breakage being configured to detect a wire breakage in the input line, the current feedback line, and the voltage feedback line, and the method of detecting a wire break comprising:

detecting whether a wire break has occurred in the input line, the current feedback line, and the voltage feedback line in accordance with a combination pattern of whether a time differential value of the value of the current flowing through the Cockcroft-Walton voltage boosting circuit when the voltage is boosted is positive, negative, or 0, and whether a time differential value of the value of the voltage after being boosted by the Cockcroft-Walton voltage boosting circuit is positive, negative, or 0; and identifying which of the input line, the current feedback line, and the voltage feedback line is broken, wherein it is determined that the wire break has occurred in the current feedback line if the combination pattern in which the time differential value of the value of the current is 0 and the time differential value of the value of the voltage is positive.

2. A method of detecting a wire break in a high voltage generating device that includes:

a voltage generating section that generates a voltage;

a voltage boosting section that incorporates a Cockcroft-Walton voltage boosting circuit for boosting voltage generated by the voltage generating section;

an input line that connects the voltage generating section to the voltage boosting section so that the generated voltage is input to the Cockcroft-Walton voltage boosting circuit;

a current feedback line that connects the voltage generating section to the voltage boosting section so that a value of a current flowing through the Cockcroft-Walton voltage boosting circuit, when the voltage is boosted, is fed back to the voltage generating section; and a voltage feedback line that connects the voltage generating section to the voltage boosting section so that a value of the voltage boosted by the Cockcroft-Walton voltage boosting circuit is fed back to the voltage generating section, the method of detecting a wire breakage being configured to detect a wire breakage in the input line, the current feedback line, and the voltage feedback line, and the method of detecting a wire break comprising:

detecting whether a wire break has occurred in the input line, the current feedback line, and the voltage feedback line in accordance with a combination pattern of whether a time differential value of the value of the current flowing through the Cockcroft-Walton voltage boosting circuit when the voltage is boosted is positive, negative, or 0, and whether a time differential value of the value of the voltage after being boosted by the Cockcroft-Walton voltage boosting circuit is positive, negative, or 0; and identifying which of the input line, the current feedback line, and the voltage feedback line is broken, wherein it is determined that the wire break has occurred in the voltage feedback line if the combination pattern in which the time differential value of the value of the current is positive and the time differential value of the value of the voltage is 0.

3. A method of detecting a wire break in a high voltage generating device that includes:

a voltage generating section that generates a voltage;

a voltage boosting section that incorporates a Cockcroft-Walton voltage boosting circuit for boosting voltage generated by the voltage generating section;

an input line that connects the voltage generating section to the voltage boosting section so that the generated voltage is input to the Cockcroft-Walton voltage boosting circuit;

a current feedback line that connects the voltage generating section to the voltage boosting section so that a value of a current flowing through the Cockcroft-Walton voltage boosting circuit, when the voltage is boosted, is fed back to the voltage generating section; and a voltage feedback line that connects the voltage generating section to the voltage boosting section so that a value of the voltage boosted by the Cockcroft-Walton voltage boosting circuit is fed back to the voltage generating section, the method of detecting a wire breakage being configured to detect a wire breakage in the input line, the current feedback line, and the voltage feedback line, and the method of detecting a wire break comprising:

detecting whether a wire break has occurred in the input line, the current feedback line, and the voltage feedback line in accordance with a combination pattern of whether a time differential value of the value of the current flowing through the Cockcroft-Walton voltage boosting circuit when the voltage is boosted is positive, negative, or 0, and whether a time differential value of the value of the voltage after being boosted by the Cockcroft-Walton voltage boosting circuit is positive, negative, or 0; and identifying which of the input line, the current feedback line, and the voltage feedback line is broken, wherein:

it is determined that the time differential value of the value of the current is 0 if the time differential value of the current value falls within a range set between upper-limit and lower-limit thresholds across 0, and the time differential value of the value of the voltage is determined to be 0 if the time differential value of the voltage value falls within a range set between upper-limit and lower-limit thresholds across 0.

* * * * *